(12) United States Patent
Lee et al.

(10) Patent No.: US 11,068,104 B2
(45) Date of Patent: Jul. 20, 2021

(54) TOUCH PANEL AND DISPLAY DEVICE INCLUDING THE SAME

(71) Applicant: Samsung Display Co., Ltd., Yongin-si (KR)

(72) Inventors: Byeong Jin Lee, Yongin-si (KR); Jin Hwan Kim, Yongin-si (KR); Mi Ae Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 101 days.

(21) Appl. No.: 16/114,679

(22) Filed: Aug. 28, 2018

(65) Prior Publication Data
US 2019/0235690 A1    Aug. 1, 2019

(30) Foreign Application Priority Data

Jan. 29, 2018    (KR) .................. 10-2018-0010856

(51) Int. Cl.
| | |
|---|---|
| *G06F 3/041* | (2006.01) |
| *G06F 3/044* | (2006.01) |
| *G02F 1/1333* | (2006.01) |
| *H01L 51/00* | (2006.01) |
| *H01L 27/32* | (2006.01) |

(52) U.S. Cl.
CPC ............ *G06F 3/0416* (2013.01); *G06F 3/044* (2013.01); *G06F 3/0412* (2013.01); *G02F 1/133305* (2013.01); *G06F 2203/04102* (2013.01); *G06F 2203/04103* (2013.01); *H01L 27/323* (2013.01); *H01L 27/3276* (2013.01); *H01L 51/0097* (2013.01)

(58) Field of Classification Search
CPC combination set(s) only.
See application file for complete search history.

(56) References Cited

U.S. PATENT DOCUMENTS

| 9,217,890 B2 | 12/2015 | Park et al. |
| 9,710,114 B2 | 7/2017 | Lee |
| 2009/0219259 A1* | 9/2009 | Kwon .................... G06F 3/041 345/173 |

(Continued)

FOREIGN PATENT DOCUMENTS

| KR | 10-2014-0092683 A | 7/2014 |
| KR | 10-2017-0077910 A | 7/2017 |

*Primary Examiner* — Temesghen Ghebretinsae
*Assistant Examiner* — Sosina Abebe
(74) *Attorney, Agent, or Firm* — Lewis Roca Rothgerber Christie LLP

(57) ABSTRACT

A touch panel includes: sensing electrodes respectively connected to sensing lines and arranged in a matrix form including columns in a first direction and rows in a second direction perpendicular to the first direction; pad electrodes respectively connected to pad lines and arranged in the second direction, a center of arrangement of the pad electrodes corresponding to a center of the rows of the sensing electrodes in the second direction; and a path determination unit connecting the sensing lines and the pad lines, the pad electrodes including: center pad electrodes; left pad electrodes; and right pad electrodes, and the pad lines including: center pad lines extended from the center pad electrodes; left pad lines extended from the left pad electrodes; and right pad lines extended from the right pad electrodes.

16 Claims, 5 Drawing Sheets

(56) References Cited

U.S. PATENT DOCUMENTS

| | | | |
|---|---|---|---|
| 2011/0074746 A1* | 3/2011 | Chang | G09G 3/20 |
| | | | 345/204 |
| 2012/0062478 A1* | 3/2012 | Kim | G06F 3/045 |
| | | | 345/173 |
| 2015/0301667 A1* | 10/2015 | Yano | G06F 3/0412 |
| | | | 345/173 |
| 2017/0185184 A1 | 6/2017 | Kim | |
| 2017/0185194 A1* | 6/2017 | Kim | G06F 3/0412 |

* cited by examiner

TOUCH PANEL AND DISPLAY DEVICE INCLUDING THE SAME

CROSS-REFERENCE TO RELATED APPLICATION

This application claims priority to and the benefit of Korean Patent Application 10-2018-0010856, filed on Jan. 29, 2018 in the Korean Intellectual Property Office, the entire disclosure of which is incorporated herein by reference.

BACKGROUND

1. Field

Aspects of embodiments of the present disclosure relate to a touch panel and a display device including the same.

2. Description of the Related Art

With the development of information technologies, the importance of a display device which is a connection medium between a user and information is increasing. Accordingly, display devices, such as a liquid crystal display device, an organic light emitting display device, and a plasma display device, are increasingly used.

Such a display device may function as a touch display device by having a touch panel. A user may input information by touching images displayed on a display surface of the touch display device.

When the touch panel is configured with a capacitive sensing type, a mutual capacitive sensing type or a self-capacitive sensing type may be applied as the capacitive sensing type.

SUMMARY

According to an aspect of embodiments, a touch panel and a display device including the same are capable of securing line widths and line intervals of pad lines sufficiently.

According to one or more embodiments of the present disclosure, a touch panel comprises: sensing electrodes respectively connected to sensing lines and arranged in a matrix form including columns in a first direction and rows in a second direction perpendicular to the first direction; pad electrodes respectively connected to pad lines and arranged in the second direction, wherein a center of arrangement of the pad electrodes corresponds to a center of the rows of the sensing electrodes in the second direction; and a path determination unit connecting the sensing lines and the pad lines, wherein the pad electrodes comprise: center pad electrodes; left pad electrodes at a left side of the center pad electrodes; and right pad electrodes at a right side of the center pad electrodes, and wherein the pad lines comprise: center pad lines extended from the center pad electrodes in the first direction; left pad lines extended from the left pad electrodes in the first direction and angled to the left side from the first direction by a first angle; and right pad lines extended from the right pad electrodes in the first direction and angled to the right side from the first direction at a second angle.

A number of the left pad electrodes and a number of the right pad electrodes may be the same as each other.

The first angle and the second angle may be the same as each other.

Straight line portions of the left pad lines extending in the first direction may be longer as the left pad lines are closer to the center pad lines.

Straight line portions of the right pad lines extending in the first direction may be longer as the right pad lines are closer to the center pad lines.

The center pad electrodes, the left pad electrodes, and the right pad electrodes may be arranged at same intervals, and line widths of the center pad lines may be greater than line widths of the left pad lines and the right pad lines.

Line intervals of the center pad lines may be greater than line intervals of the left pad lines and the right pad lines.

A number of sensing lines and a number of pad lines may be the same as each other, and the path determination unit may comprise conductive lines respectively connecting the sensing lines and the pad lines.

A number of the sensing lines may be greater than a number of the pad lines, and the path determination unit may comprise a multiplexer for connecting some of the sensing lines to the pad lines.

At least two of the sensing electrodes having different electrical nodes may be positioned at each of the rows and the columns of the sensing electrodes.

The touch panel may further comprise: a film; a bottom metal layer under a bottom surface of the film and connected to the pad electrodes; a top metal layer on a top surface of the film and connected to the bottom metal layer through a via hole of the film; and a touch driver integrated circuit (IC) electrically connected to the top metal layer.

The touch panel may further comprise: a substrate supporting bottom portions of the sensing electrodes; and a protective layer covering top portions of the sensing electrodes, wherein a thickness of the protective layer is less than a thickness of the substrate.

According to one or more embodiments of the present disclosure, a display device comprises: a display panel; an anti-reflection layer adhered to a top portion of the display panel by a first adhesive layer; a touch panel comprising a substrate adhered to a top portion of the anti-reflection layer by a second adhesive layer; and a window adhered to a top portion of the touch panel by a third adhesive layer, wherein the touch panel comprises: pad electrodes on the substrate; a film; a bottom metal layer under a bottom surface of the film and connected to the pad electrodes; a top metal layer on a top surface of the film and connected to the bottom metal layer through a via hole of the film; and a touch driver IC electrically connected to the top metal layer.

The display device may further comprise: sensing electrodes respectively connected to sensing lines and arranged in a matrix form including columns in a first direction and rows in a second direction perpendicular to the first direction, wherein the pad electrodes are respectively connected to pad lines connected to the sensing lines, the pad electrodes are arranged in the second direction, and a center of arrangement of the pad electrodes corresponds to a center of the rows of the sensing electrodes in the second direction, wherein the pad electrodes comprise: center pad electrodes; left pad electrodes at a left side of the center pad electrodes; and right pad electrodes at a right side of the center pad electrodes, and wherein the pad lines comprise: center pad lines extended from the center pad electrodes in the first direction; left pad lines extended from the left pad electrodes in the first direction and angled to the left side from the first direction at a first angle; and right pad lines extended from the right pad electrodes in the first direction and angled to the right side from the first direction at a second angle.

A number of left pad electrodes and a number of right pad electrodes may be the same as each other, and the first angle and the second angle may be the same as each other.

At least two of the sensing electrodes having different electrical nodes may be positioned at each of the rows and columns of the sensing electrodes.

BRIEF DESCRIPTION OF THE DRAWINGS

Some example embodiments will now be described more fully herein with reference to the accompanying drawings; however, the present disclosure may be embodied in different forms and should not be construed as limited to the embodiments set forth herein. Rather, these embodiments are provided so that this disclosure will be thorough and complete, and will fully convey the scope of the present disclosure to those skilled in the art.

DETAILED DESCRIPTION

Figure 1:
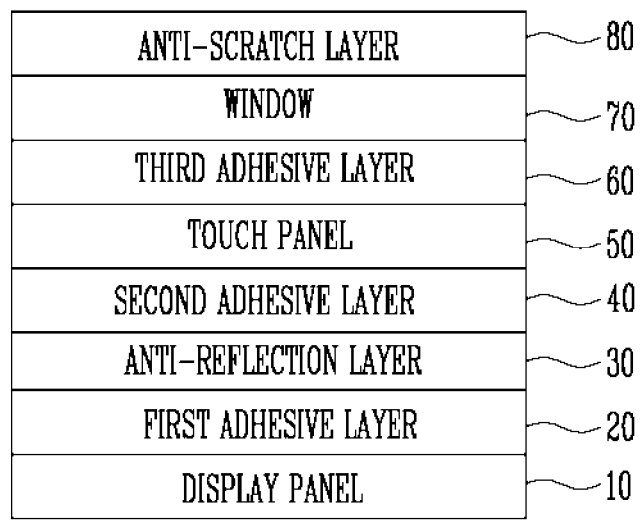
FIG. 1 is a schematic view illustrating a display device according to an embodiment of the present disclosure.

Herein, some exemplary embodiments are described in further detail with reference to the accompanying drawings so that those skilled in the art may easily practice the present disclosure. The present disclosure may be implemented in various different forms and is not limited to the exemplary embodiments described in the present specification.

Description of parts irrelevant to the description may be omitted to clearly describe the present disclosure, and the same or similar constituent elements will be designated by the same reference numerals throughout the specification. Therefore, the same reference numerals may be used in different drawings to identify the same or similar elements.

In the drawing figures, dimensions may be exaggerated for clarity of illustration. It is to be understood that when an element is referred to as being "between" two elements, it may be the only element between the two elements, or one or more intervening elements may also be present. Like reference numerals refer to like elements throughout.

In addition, the size and thickness of each component illustrated in the drawings may be arbitrarily shown for better understanding and ease of description, but the present disclosure is not limited thereto. Thicknesses of several portions and areas may be exaggerated for clarity of illustration.

FIG. 1 is a schematic view illustrating a display device according to an embodiment of the present disclosure.

Referring to FIG. 1, a display device 1 according to an embodiment of the present disclosure may include a display panel 10, a first adhesive layer 20, an anti-reflection layer 30, a second adhesive layer 40, a touch panel 50, a third adhesive layer 60, a window 70, and an anti-scratch layer 80.

The display panel 10 may be variously configured according to a type of the display device. In a case of an organic light emitting display, each pixel of the display panel 10 may include an organic light emitting diode, and an image may be displayed according to emission combinations of the organic light emitting diodes. In some embodiments, the organic light emitting diodes may have their own colors or may have separated color filter layers. In a case of a liquid crystal display device, each pixel of the display panel 10 may adjust liquid crystal alignments of a liquid crystal layer to determine an amount of the passing light from a backlight unit. The passed light has a color through the color filter layer of each pixel, and a color image corresponding thereto may be displayed. Although not shown in the drawings, a set may be positioned below the display panel 10. The set may be a collective component having an antenna, a battery, and other electronic components such as an application processor (AP).

The anti-reflection layer 30 may be adhered to a top portion of the display panel 10 by using the first adhesive layer 20. In an embodiment, the first adhesive layer 20 may be a pressure sensitive adhesive (PSA), such as an optical clear adhesive (OCA) film or the like. In an embodiment, for example, the anti-reflection layer 30 may be a polarizer, and external light reflected from internal electrodes or the like may not pass through the polarizer again due to the changed polarization state from incident external light.

The touch panel 50 may include a substrate adhered to a top portion of the anti-reflection layer 30 by using the second adhesive layer 40. In an embodiment, for example, the second adhesive layer 40 may be a pressure sensitive adhesive, such as an optical clear adhesive (OCA) film or the like. In an embodiment, the touch panel 50 may be configured with a capacitive sensing type, and a mutual capacitive sensing type or a self-capacitive sensing type may be applied as the capacitive sensing type. An example structure of the touch panel 50 will be described below with reference to FIGS. 2 to 6, and an example driving method of the touch panel 50 will be described below with reference to FIG. 7.

The touch panel 50 is provided on the anti-reflection layer 30 as an example, but the present disclosure is not limited thereto. For example, the touch panel 50 may be provided between the anti-reflection layer 30 and the display panel 10.

The window 70 may be adhered to a top portion of the touch panel 50 by using the third adhesive layer 60. In an embodiment, for example, the third adhesive layer 60 may be a pressure sensitive adhesive, such as an optical clear adhesive film or the like. In an embodiment, for example, the window 70 may be composed of a glass material, a plastic material, or the like. The window 70 performs a protective function by covering the touch panel 50, the anti-reflection layer 30, and the display panel 10.

The anti-scratch layer 80 may be optionally positioned on the window 70. In an embodiment, the anti-scratch layer 80 may be composed of polyurethane or the like. In a case in which the window 70 is composed of a glass material, the anti-scratch layer 80 may be omitted since the hardness of the window 70 is sufficiently high. Also, if the window 70 is composed of a plastic material, the anti-scratch layer 80 may be optionally included or may not be included in the display device, depending on the hardness of the window 70.

In an embodiment, the display device 1 according to the embodiment of FIG. 1 may be an example of a foldable display device. In an embodiment, the display device 1 may be a flexible display device or a rollable display device. In an embodiment, the substrate constituting the window 70 or the panels 10 and 50 is composed of a flexible plastic material rather than a glass material.

Figure 2:
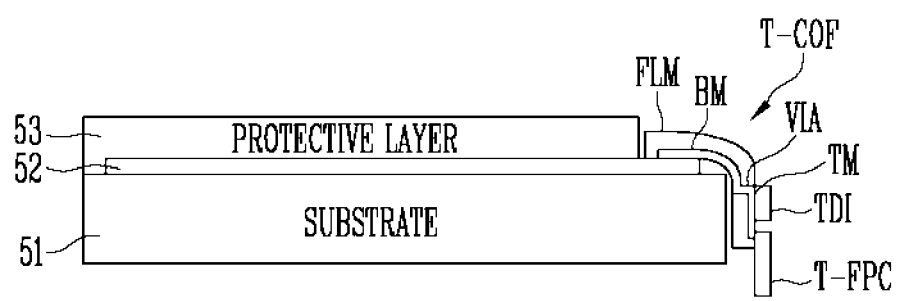
FIG. 2 is a side view illustrating a touch panel according to an embodiment of the present disclosure.

FIG. 2 is a side view illustrating a touch panel according to an embodiment of the present disclosure.

Referring to FIG. 2, the touch panel 50 according to an embodiment of the present disclosure may include a substrate 51, a conductive layer 52, a protective layer 53, a touch-COF T-COF, a touch driver IC TDI, and a touch-FPC T-FPC.

The conductive layer 52 may include sensing electrodes, sensing lines, pad lines, and pad electrodes shown in FIGS. 3 to 7. The sensing electrodes, the sensing lines, the pad lines, and the pad electrodes will be described below with reference to FIGS. 3 to 7.

The substrate 51 supports a bottom portion of the conductive layer 52. In an embodiment, the substrate 51 may be composed of a flexible plastic material. In an embodiment, for example, the substrate 51 may be composed of a synthetic resin material, such as polyethylene terephthalate (PET) or the like. Although the separate substrate 51 is shown in this embodiment, the display panel 10 or the anti-reflection layer 30 may function as a substrate, depending on a product.

The protective layer 53 covers a top portion of the conductive layer 52. In an embodiment, for example, the protective layer 53 may be composed of an organic polymer film, such as acrylate or the like. According to an embodiment, the protective layer 53 may not cover the pad electrodes of the conductive layer 52, and the pad electrodes are exposed to the outside. In another embodiment, the protective layer 53 may include openings to expose the pad electrodes of the conductive layer 52 to the outside.

The touch-COF T-COF may include a film FLM, a bottom metal layer BM, and a top metal layer TM. As used herein, COF refers to "chip on film". The film FLM may be composed of a flexible plastic material, such as polyimide or the like. The bottom metal layer BM may be positioned under a bottom surface of the film FLM and connected to the pad electrodes of the conductive layer 52. The top metal layer TM may be positioned on a top surface of the film FLM and connected to the bottom metal layer BM through a via hole VIA of the film FLM.

The touch driver IC TDI may be electrically connected to the top metal layer TM. Also, the touch-FPC T-FPC may be electrically connected to the top metal layer TM. As used herein, FPC refers to "flexible printed circuit." The touch-FPC T-FPC may be electrically connected to the set. Therefore, the touch driver IC TDI is electrically connected to the sensing electrodes of the conductive layer 52 and the set through the touch-COF T-COF and is positioned in the vertical direction of the stacked structure of the display device 1, such that the space efficiency of the display device 1 may be increased.

According to an embodiment, a thickness of the protective layer 53 may be less than a thickness of the substrate 51. As described above, when the display device 1 include the touch-COF T-COF in which electrodes are disposed on both sides, the protective layer 53 may be positioned in a display surface direction of the display device 1. A user body, such as fingers or the like, and the sensing electrodes may be brought closer to each other, thereby increasing a sensing sensitivity.

Figure 3:
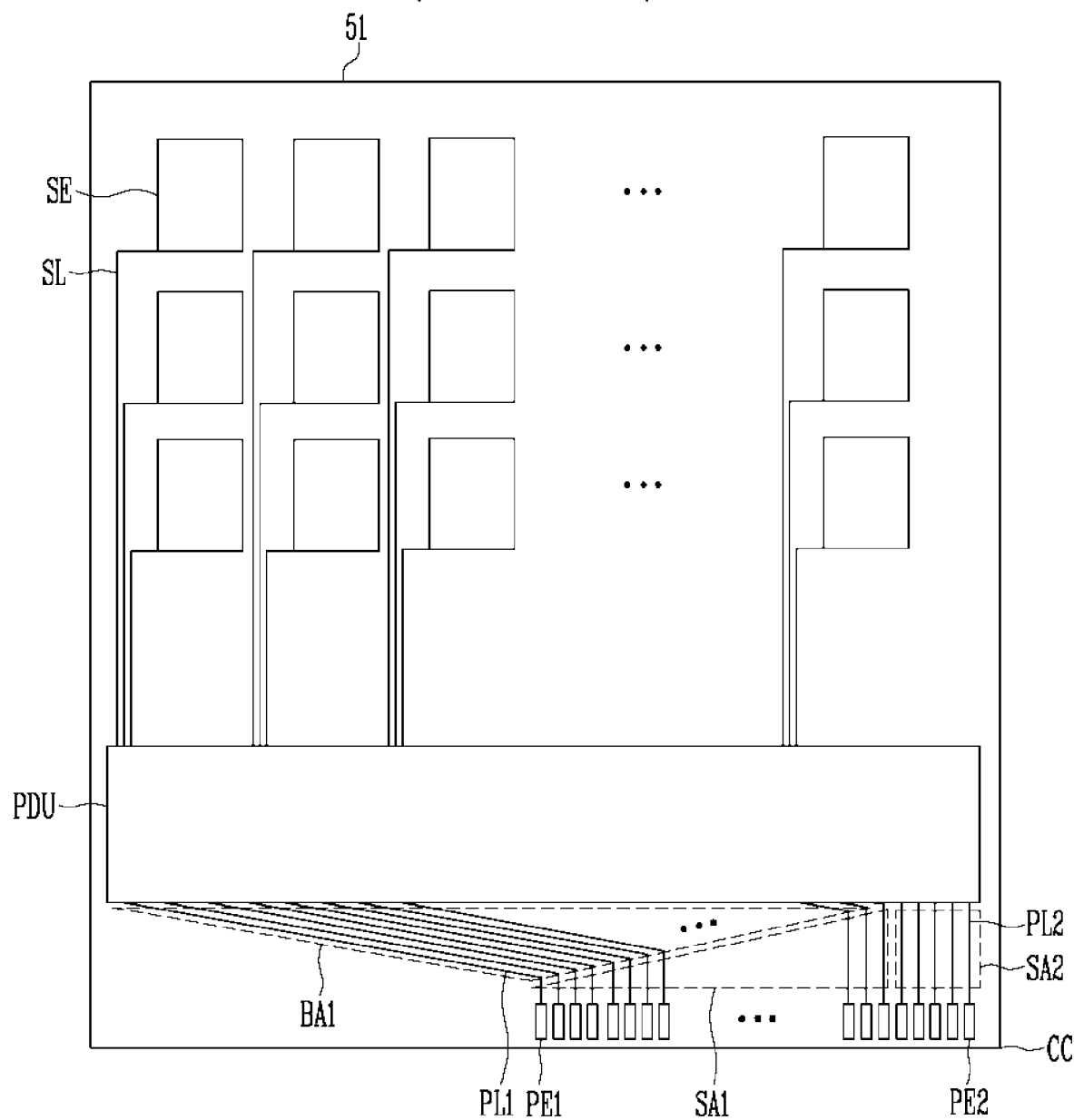
FIGS. 3 and 4 are views illustrating conventional pad lines and pad electrodes.
Figure 4:
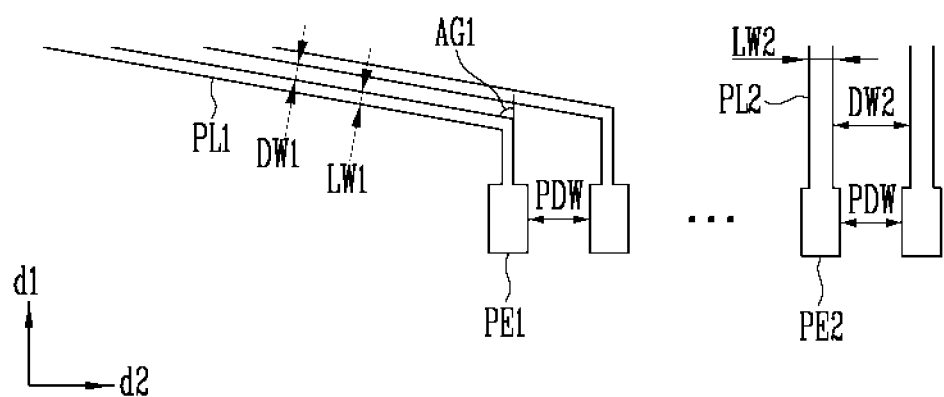

FIGS. 3 and 4 are views illustrating conventional pad lines and pad electrodes. However, a description of the other components except pad lines PL1 and PL2 and pad electrodes PE1 and PE2 in FIGS. 3 and 4 may be applied to embodiments of the present disclosure (see FIGS. 5 and 6). FIGS. 3 and 4 will be described here before the description of FIGS. 5 and 6.

Referring to FIGS. 3 and 4, sensing electrodes SE, sensing lines SL, a path determination unit PDU, the pad lines PL1 and PL2, and the pad electrodes PE1 and PE2 are positioned on the substrate 51.

The sensing electrodes SE may be respectively connected to the sensing lines SL and arranged in a matrix form including columns in a first direction d1 and rows in a second direction d2 perpendicular to the first direction d1. The pad electrodes PE1 and PE2 are connected to the pad lines PL1 and PL2, respectively. The sensing electrodes SE may be positioned such that at least a portion of the sensing electrodes SE overlaps a display area in a plan view. The pad electrodes PE1 and PE2 and the pad lines PL1 and PL2 may be positioned such that at least a portion thereof overlaps a non-display area in a plan view. Therefore, the sensing electrodes SE may be positioned in a center area of the substrate 51 and the pad electrodes PE1 and PE2 may be positioned in an edge area of the substrate 51.

In an embodiment, the sensing electrodes SE, the sensing lines SL, the pad electrodes PE1 and PE2, and the pad lines PL1 and PL2 may be concurrently (e.g., simultaneously) formed by patterning a conductive layer. According to an embodiment, the conductive layer may be composed of non-transparent low-resistance conductors. The sensing electrodes SE may be in a mesh pattern so as not to block pixels of the display panel 10.

In another embodiment, the sensing electrodes SE, the sensing lines SL, the pad electrodes PE1 and PE2, and the pad lines PL1 and PL2 may be formed of different conductive layers connected through via holes of an insulating layer. In an embodiment, the sensing electrodes SE may be composed of transparent conductors, such as indium tin oxide (ITO) and may be in a plate form overlapping the pixels of the display panel 10 in a plan view.

In FIGS. 3 and 4, at least two sensing electrodes having different electrical nodes may be positioned at each of the rows (direction d1) and the columns (direction d2) of the sensing electrodes SE. That is, the sensing electrodes SE and the sensing lines SL of the touch panel 50 may be positioned in a self-capacitance manner.

The path determination unit PDU may connect the sensing lines SL and the pad lines PL1 and PL2. In an embodiment, the number of sensing lines SL may be greater than the number of pad lines PL1 and PL2, and the path determination unit PDU may be a multiplexer for connecting some of the sensing lines which are selected to the pad lines PL1 and PL2. In an embodiment, the number of sensing lines SL and the number of pad lines PL1 and PL2 may be the same as each other, and the path determination unit PDU may include conductive lines connecting the sensing lines SL and the pad lines PL1 and PL2, respectively. The path determination unit PDU, the sensing lines SL, and the pad lines PL1 and PL2 may indicate the same components (conductive lines).

In FIGS. 3 and 4, the pad electrodes PE1 and PE2 may be arranged in an edge area extending along one side from one corner of the substrate 51. For example, when the substrate 51 is configured as a square and therefore has four corners, the pad electrodes PE1 and PE2 may be arranged along one side in an edge area adjacent to a certain corner CC rather than the other three corners. Referring to FIG. 3, the pad electrodes PE1 and PE2 are eccentric to the certain corner CC positioned in a first opposite direction (−)d1 and the second direction d2 of the substrate 51.

The pad electrodes PE2 adjacent to the certain corner CC may be connected to the pad lines PL2 extending in the first direction d1. The pad lines PL2 may have straight line portions in a straight line area SA2. The straight line area SA2 may have a rectangular form.

However, as the pad electrodes PE1 are away from the certain corner CC (i.e., in a second opposite direction (−)d2), the pad electrodes PE1 may be connected to the pad lines PL1 extended in the first direction d1 and angled (e.g., curved) from the first direction d1 at a first angle AG1. The pad electrodes PE1 are positioned farther from the certain corner CC than the pad electrodes PE2. The pad lines PL1 may have straight line portions in a straight line area SA1 and may have diagonal line portions in a diagonal line area BA1. In order to minimize or reduce an area covered by the pad lines PL1, the straight line area SA1 may be determined as a triangle shape, and the diagonal line area BA1 may be determined as an inverted triangle shape in which one side corresponds to the hypotenuse of the straight line area SA1. That is, the straight line portions of the pad lines PL1 which extend in the first direction d1 may be longer as the pad lines PL1 are closer to the pad lines PL2.

Referring to FIG. 4, the pad electrodes PE1 and PE2 may be arranged at same intervals PDW. However, in comparison with line widths LW2 and line intervals DW2 of the pad lines PL2 including only the straight line portions, line widths LW1 and line intervals DW1 of the pad lines PL1 including the straight line portions and the diagonal line portions may be geometrically smaller. The line widths LW1 and the line intervals DW1 of the pad lines PL1 may become smaller as the first angle AG1 becomes larger.

Accordingly, the relatively thin pad lines PL1 are likely to be defective, such as due to disconnection or the like in a lamination process. Particularly, these defects may occur more frequently in the self-capacitive sensing type in which a larger number of pad lines PL1 and PL2 are required than in the mutual capacitive sensing type.

Figure 5:
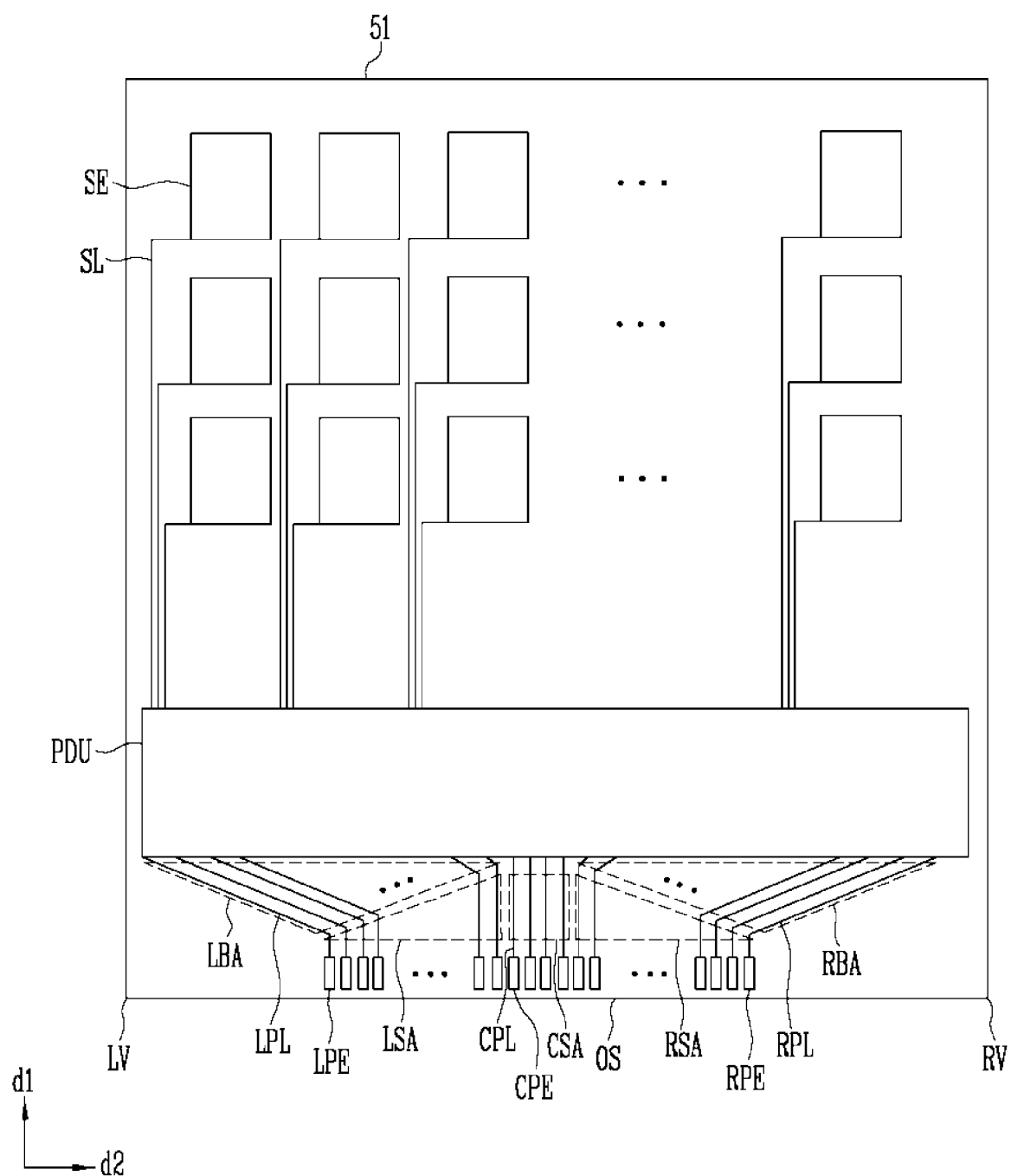
FIGS. 5 and 6 are views illustrating pad lines and pad electrodes according to an embodiment of the present disclosure.
Figure 6:
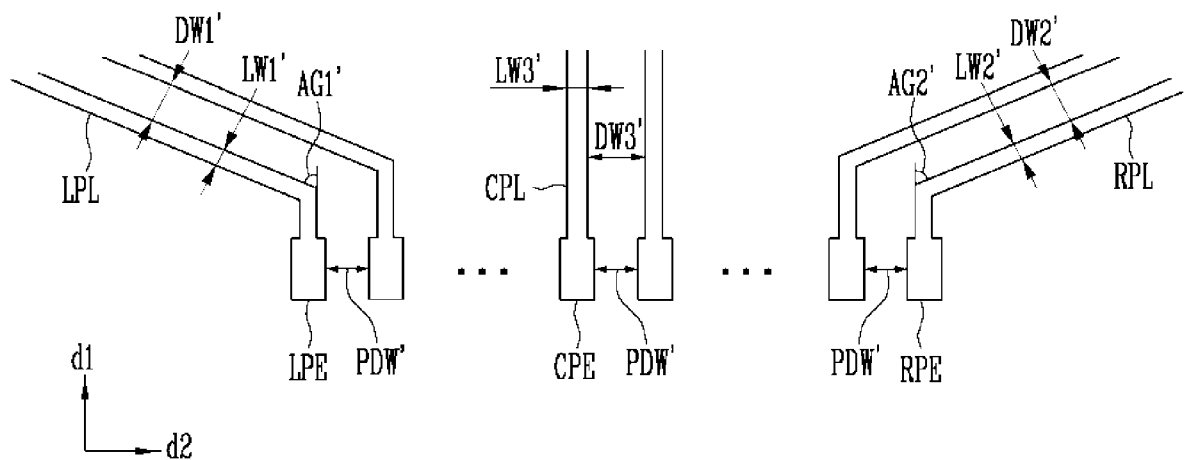

FIGS. 5 and 6 are views illustrating pad lines and pad electrodes according to an embodiment of the present disclosure.

In FIGS. 5 and 6, the substrate 51, the sensing electrodes SE, the sensing lines SL, and the path determination unit PDU may be the same as those in FIGS. 3 and 4, and repeated description thereof will be omitted.

In the embodiment of FIGS. 5 and 6, center pad electrodes CPE, left pad electrodes LPE, and right pad electrodes RPE are connected to center pad lines CPL, left pad lines LPL, and right pad lines RPL respectively. In addition, the pad electrodes CPE, LPE, and RPE are arranged in the second direction d2, and a center of arrangement of the pad electrodes CPE, LPE, and RPE corresponds to a center of the rows of the sensing electrodes SE in the second direction d2.

The touch panel 50 includes the center pad electrodes CPE, the left pad electrodes LPE positioned at the left side of the center pad electrodes CPE, and the right pad electrodes RPE positioned at the right side of the center pad electrodes CPE. Herein, the left side may refer to the second opposite direction (−)d2, and the right side may refer to the second direction d2. In an embodiment, the left pad electrodes LPE and the right pad electrodes RPE may be symmetrically arranged with respect to the center pad electrodes CPE. The pad electrodes CPE, LPE, and RPE may be arranged in the second direction d2. In an embodiment, for example, a number of the left pad electrodes LPE and a number of the right pad electrodes RPE may be the same as each other.

In an embodiment, the pad electrodes CPE, LPE, and RPE may be arranged in an edge area extending along a side OS of the substrate 51 and may be arranged symmetrically from a center of the side OS. For example, a distance between a left vertex LV (a corner of the substrate 51 which is positioned in the directions (−)d1 and (−)d2 from a center thereof) of the side OS and the leftmost pad electrode among the left pad electrodes LPE and a distance between a right vertex RV (a corner of the substrate 51 which is positioned in the directions (−)d1 and d2 from the center thereof) of the side OS and the rightmost pad electrode of the right pad electrodes RPE may be the same (identical or substantially identical) as each other.

The touch panel 50 includes center pad lines CPL extended from the center pad electrodes CPE in the first direction d1, left pad lines LPL extended from the left pad electrodes LPE in the first direction d1 and angled (e.g., curved) to the left side from the first direction d1 at a first angle AG1', and right pad lines RPL extended from the right pad electrodes RPE in the first direction d1 and angled (e.g., curved) to the right side from the first direction d1 at a second angle AG2'. In an embodiment, for example, the angles AG1' and AG2' at which the left pad lines LPL and the right pad lines RPL are bent may be the same as each other.

The center pad lines CPL may have straight line portions in a straight line area CSA. The straight line area CSA may have a rectangular form.

The left pad lines LPL may have straight line portions in a straight line area LSA and may have diagonal line portions in a diagonal line area LBA. In order to minimize or reduce an area covered by the left pad lines LPL, the straight line area LSA may be determined as a triangle shape, and the diagonal line area LBA may be determined as an inverted triangle shape in which one side corresponds to the hypotenuse of the straight line area LSA. That is, the straight line portions of the left pad lines LPL which extend in the first direction d1 may be longer as the left pad lines LPL are closer to the center pad lines CPL.

The right pad lines RPL may have straight line portions in a straight line area RSA and may have diagonal line portions in a diagonal line area RBA. In order to minimize or reduce an area covered by the right pad lines RPL, the straight line area RSA may be determined as a triangle shape, and the diagonal line area RBA may be determined as an inverted triangle shape in which one side corresponds to the hypotenuse of the straight line area RSA. That is, the straight line portions of the right pad lines RPL which extend in the first direction d1 may be longer as the right pad lines RPL are closer to the center pad lines CPL.

Referring to FIG. 6, in an embodiment, the pad electrodes LPE, CPE, and RPE may be arranged at same intervals PDW'. In an embodiment, in comparison with line widths LW3' and line intervals DW3' of the center pad lines CPL including only the straight line portions, line widths LW1' and line intervals DW1' of the left pad lines LPL including the straight line portions and the diagonal line portions may be geometrically smaller. In an embodiment, the line widths LW1' and the line intervals DW1' of the left pad lines LPL may become smaller as the first angle AG1' becomes larger. In an embodiment, in comparison with the line widths LW3' and the line intervals DW3' of the center pad lines CPL including only the straight line portions, line widths LW2' and line intervals DW2' of the right pad lines RPL including the straight line portions and the diagonal line portions may be geometrically smaller. In an embodiment, the line widths LW2' and the line intervals DW2' of the right pad lines RPL may become smaller as the first angle AG2' becomes larger.

However, the angles AG1' and AG2' in FIG. 6 are smaller than the first angle AG1 in FIG. 4 since a length of the diagonal line portions of the outermost pad lines of FIG. 5 is relatively short when the number of pad electrodes PE1 and PE2 of FIG. 3 and the number of pad electrodes LPE, CPE, and RPE are the same as each other.

Therefore, the line widths LW1' and LW2' and the line intervals DW1' and DW2' of the diagonal line portions of the pad lines LPL and RPL of FIG. 6 which are greater than the line widths LW1 and the line intervals DW1 of the diagonal line portions of the pad lines PL1 of FIG. 4 are secured. Therefore, even if the lamination process is performed, defects such as disconnection in the pad lines LPL and RPL are less likely to occur.

In an embodiment, the pad lines LPL and RPL of FIG. 6 are bilaterally symmetrical, and resistance distribution is uniform compared to the pad lines PL1 and PL2 of FIG. 4.

Figure 7:
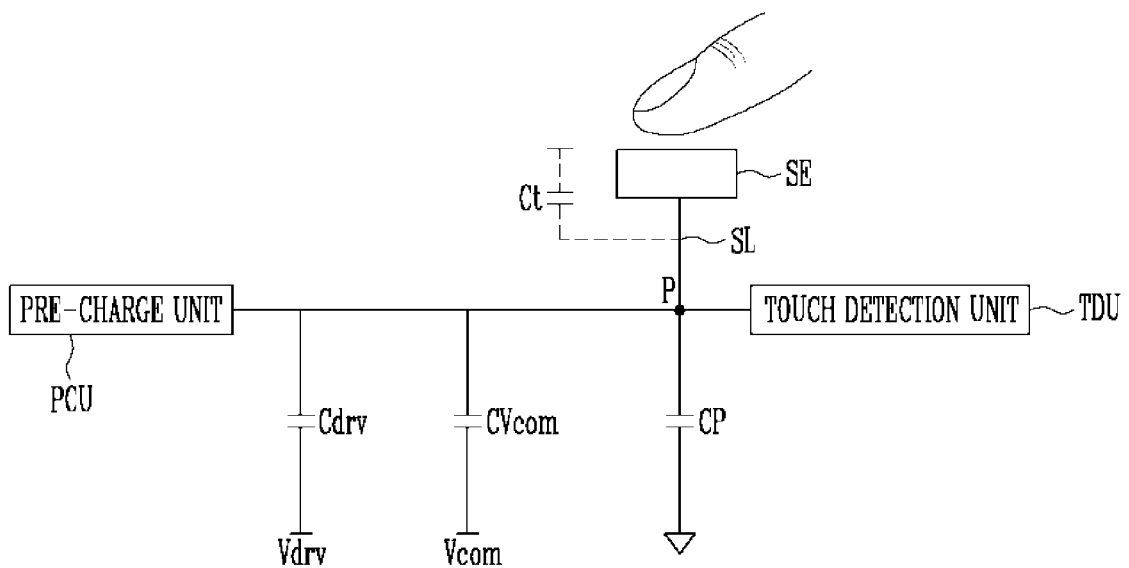
FIG. 7 is a view illustrating a driving method of a touch panel according to an embodiment of the present disclosure.

FIG. 7 is a view illustrating a driving method of a touch panel according to an embodiment of the present disclosure.

Referring to FIG. 7, components below a node P to which the sensing electrode SE and the sensing line SL as described above are connected are shown as an example. The node P may be positioned in the path determination unit PDU, may be positioned at the pad electrode, or may be variously determined depending on the product. Herein, it is assumed that the node P is a pad electrode corresponding to the sensing electrode SE and the sensing line SL.

The touch driver IC TDI may include, for example, a pre-charge unit PCU, a touch detection unit TDU, and a driving capacitor Cdrv. One end of the driving capacitor Cdrv may be connected to the node P. A common capacitance CVcom is a capacitance between a common electrode of the display panel 10 and the sensing electrode SE. A parasitic capacitance CP is a capacitance between other conductive materials and the sensing electrode SE. A touch capacitance Ct is a capacitance between a body of a user, such as a finger or the like, and the sensing electrode SE. The common electrode of the display panel 10 may be a cathode electrode when the display panel 10 is an organic light emitting display device or may be a common electrode when the display panel 10 is a liquid crystal display device. The parasitic capacitance CP may be a parasitic capacitance formed by the adjacent sensing electrode SE, the adjacent sensing line SL, and other adjacent conductors.

Herein, a driving method of the touch panel will be described as an example.

The pre-charge unit PCU may initialize the node P with a pre-charge voltage for a first period. Therefore, a voltage of the node P may be constant regardless of whether or not the user touches the sensing electrode SE in the previous cycle.

During a next second period, the touch driver IC TDI may change the voltage of the node P by applying a specific voltage Vdrv at the other end of the driving capacitor Cdrv. The voltage of the node P determined by the capacitances Cdrv, CVcom, and CP may be referred to as a first voltage when the user's finger is not present near the sensing electrode SE. The voltage of the node P determined by the capacitances Cdrv, CVcom, CP, and Ct may be referred to as a second voltage when the user's finger is present near the sensing electrode SE. Since the capacitances Cdrv, CVcom, and CP are fixed capacitances, a difference between the first voltage and the second voltage occurs depending on the difference of the touch capacitance Ct. In an embodiment, the pre-charge unit PCU and the touch detection unit TDU may be in a floating state with respect to the node P.

During a next third period, the touch detection unit TDU receives the voltage of the node P. The touch detection unit TDU may determine that there is no touch by the user when the first voltage is inputted, or may determine that there is a touch by the user when the second voltage is inputted.

The above-described driving method of the touch panel is based on the self-capacitive sensing type. When the display device 1 is a foldable display device, it is important to reduce its thickness. However, the smaller the thickness of the display device 1 is, the more frequently a retransmission issue in which an electric field is generated from a transmitting electrode to the user's finger and an electric field is again generated from the user's finger to the receiving electrode occurs. Since peak sensitivity is lowered, a ghost touch may be recognized.

However, in the case in which the touch panel 50 is based on the self-capacitive sensing type as in the embodiment of FIG. 7, there occurs no retransmission issue since there is no receiving electrode, such that the display device 1 having a sufficiently small thickness may be manufactured.

In the touch panel and the display device including the same according to the present disclosure, line widths and line intervals of pad lines may be secured sufficiently.

Some example embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A touch panel comprising:
sensing electrodes respectively connected to sensing lines and arranged in a matrix form including columns in a first direction and rows in a second direction crossing the first direction;
pad electrodes respectively connected to pad lines and arranged in an edge area of the touch panel along the second direction, wherein a center of arrangement of the pad electrodes corresponds to a center of the rows of the sensing electrodes in the second direction;
a path determination unit connecting the sensing lines and the pad lines;
a film;
a bottom metal layer under a bottom surface of the film and connected to the pad electrodes;
a top metal layer on a top surface of the film and connected to the bottom metal layer through a via hole of the film; and
a touch driver integrated circuit electrically connected to the top metal layer,
wherein the pad electrodes comprise:
center pad electrodes;
left pad electrodes at a left side of the center pad electrodes; and
right pad electrodes at a right side of the center pad electrodes,
wherein the pad lines comprise:
center pad lines extended from the center pad electrodes in the first direction;
left pad lines extended from the left pad electrodes in the first direction and angled away from the center pad lines to the left side from the first direction at a first angle; and
right pad lines extended from the right pad electrodes in the first direction and angled away from the center pad lines to the right side from the first direction at a second angle, and wherein the pad lines are symmetrically arranged with respect to each other around a central area of the touch panel in the second direction, the central area including the center of the rows of the sensing electrodes.

2. The touch panel of claim 1, wherein a number of the left pad electrodes and a number of the right pad electrodes are the same as each other.

3. The touch panel of claim 2, wherein the first angle and the second angle are the same as each other.

4. The touch panel of claim 1, wherein straight line portions of the left pad lines extending in the first direction are longer as the left pad lines are closer to the center pad lines.

5. The touch panel of claim 4, wherein straight line portions of the right pad lines extending in the first direction are longer as the right pad lines are closer to the center pad lines.

6. The touch panel of claim 1,
wherein the center pad electrodes, the left pad electrodes, and the right pad electrodes are arranged at same intervals, and
wherein line widths of the center pad lines are greater than line widths of the left pad lines and the right pad lines.

7. The touch panel of claim 6, wherein line intervals of the center pad lines are greater than line intervals of the left pad lines and the right pad lines.

8. The touch panel of claim 1,
wherein a number of the sensing lines and a number of the pad lines are the same as each other, and
wherein the path determination unit comprises conductive lines connecting the sensing lines and the pad lines respectively.

9. The touch panel of claim 1,
wherein a number of the sensing lines is greater than a number of the pad lines, and
wherein the path determination unit comprises a multiplexer for connecting some of the sensing lines to the pad lines.

10. The touch panel of claim 1, wherein at least two of the sensing electrodes having different electrical nodes are positioned at each of the rows and the columns of the sensing electrodes.

11. The touch panel of claim 1, further comprising:
a substrate supporting bottom portions of the sensing electrodes; and
a protective layer covering top portions of the sensing electrodes,
wherein a thickness of the protective layer is less than a thickness of the substrate.

12. A display device comprising:
a display panel;
an anti-reflection layer adhered to a top portion of the display panel by a first adhesive layer;
a touch panel comprising a substrate adhered to a top portion of the anti-reflection layer by a second adhesive layer; and
a window adhered to a top portion of the touch panel by a third adhesive layer,
wherein the touch panel comprises:
pad electrodes on the substrate;
a film;
a bottom metal layer under a bottom surface of the film and connected to the pad electrodes;
a top metal layer on a top surface of the film and connected to the bottom metal layer through a via hole of the film; and
a touch driver integrated circuit electrically connected to the top metal layer, and
wherein the pad electrodes are connected to the touch driver integrated circuit through the bottom metal layer, the via hole, and the top metal layer.

13. The display device of claim 12, further comprising:
sensing electrodes respectively connected to sensing lines and arranged in a matrix form including columns in a first direction and rows in a second direction perpendicular to the first direction,
wherein the pad electrodes are respectively connected to pad lines connected to the sensing lines, the pad electrodes are arranged in the second direction, and a center of arrangement of the pad electrodes corresponds to a center of the rows of the sensing electrodes in the second direction,
wherein the pad electrodes comprise:
center pad electrodes;
left pad electrodes at a left side of the center pad electrodes; and
right pad electrodes at a right side of the center pad electrodes, and
wherein the pad lines comprise:
center pad lines extended from the center pad electrodes in the first direction;
left pad lines extended from the left pad electrodes in the first direction and angled to the left side from the first direction at a first angle; and
right pad lines extended from the right pad electrodes in the first direction and angled to the right side from the first direction at a second angle.

14. The display device of claim 13,
wherein a number of the left pad electrodes and a number of the right pad electrodes are the same as each other, and
wherein the first angle and the second angle are the same as each other.

15. The display device of claim 14, wherein at least two of the sensing electrodes having different electrical nodes are positioned at each of the rows and the columns of the sensing electrodes.

16. The display device of claim 13, wherein the left pad lines are extended from the left pad electrodes in the first direction and angled away from the center pad lines to the left side from the first direction at the first angle, and the right pad lines are extended from the right pad electrodes in the first direction and angled away from the center pad lines to the right side from the first direction at the second angle.

* * * * *